United States Patent
Tian

(10) Patent No.: US 11,172,593 B2
(45) Date of Patent: Nov. 9, 2021

(54) HEAT DISSIPATION SYSTEM

(71) Applicant: Lenovo (Beijing) Co., Ltd., Beijing (CN)

(72) Inventor: Ting Tian, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 0 days.

(21) Appl. No.: 16/833,207

(22) Filed: Mar. 27, 2020

(65) Prior Publication Data
US 2020/0315055 A1  Oct. 1, 2020

(30) Foreign Application Priority Data

Mar. 29, 2019  (CN) .......................... 201910256197.8

(51) Int. Cl.
| | | |
|---|---|---|
| H05K 7/20 | (2006.01) | |
| F28F 13/10 | (2006.01) | |
| F28F 13/12 | (2006.01) | |

(52) U.S. Cl.
CPC ............. *H05K 7/203* (2013.01); *F28F 13/10* (2013.01); *F28F 13/125* (2013.01); *H05K 7/20236* (2013.01); *H05K 7/20272* (2013.01); *H05K 7/20327* (2013.01); *H05K 7/20772* (2013.01); *H05K 7/20809* (2013.01)

(58) Field of Classification Search
CPC ..... H01L 23/473; H01L 23/467; G06F 1/203; G06F 1/20; F28F 13/10; F28F 13/12; F28F 13/125; H05K 7/20327; H05K 7/20272; H05K 7/20809; H05K 7/20772; H05K 7/20927; H05K 7/20981; H05K 7/20236
See application file for complete search history.

(56) References Cited

U.S. PATENT DOCUMENTS

| | | | |
|---|---|---|---|
| 2002/0075645 A1* | 6/2002 | Kitano ................... | G06F 1/203 361/679.53 |
| 2004/0190305 A1* | 9/2004 | Arik ...................... | F21V 29/503 362/555 |
| 2004/0253130 A1* | 12/2004 | Sauciuc ................. | F04D 33/00 417/436 |
| 2005/0121171 A1* | 6/2005 | Mukasa .................. | F04F 7/00 165/80.3 |
| 2006/0050832 A1* | 3/2006 | Buckley .................. | G21G 4/00 376/194 |
| 2007/0186561 A1 | 8/2007 | Breier et al. | |
| 2008/0104970 A1* | 5/2008 | Suzuki ................... | F28F 13/02 62/64 |

FOREIGN PATENT DOCUMENTS

| | | |
|---|---|---|
| CN | 1694611 A | 11/2005 |
| CN | 102118953 A | 7/2011 |
| CN | 103841810 A | 6/2014 |
| CN | 108008795 A | 5/2018 |

* cited by examiner

*Primary Examiner* — Adam B Dravininkas
(74) *Attorney, Agent, or Firm* — Anova Law Group, PLLC

(57) ABSTRACT

The present disclosure provides a heat dissipation system, including: a coolant and a convection accelerator. The coolant is configured to contact at least a portion of the heat generating device; the convection accelerator is disposed in a predetermined region surrounding the heat generating device, configured to accelerate a flow of the coolant surrounding the heat generating device.

20 Claims, 8 Drawing Sheets

HEAT DISSIPATION SYSTEM

CROSS-REFERENCE TO RELATED APPLICATION

This application claims the priority to Chinese Patent Application No. 201910256197.8, entitled "Heat Dissipation System," filed on Mar. 29, 2019, the entire content of which is incorporated herein by reference.

TECHNICAL FIELD

The present disclosure relates to a heat dissipation system.

BACKGROUND

Immersion liquid cooling is a cooling method with high cooling efficiency, mainly by directly immersing electronic equipment such as a server into a non-conductive, non-corrosive and non-flammable fluid, with a heat dissipation method by directly carrying away heat through liquid convection or phase change and dissipating heat to outside the system.

With rapid development of chip technology, the heat flux density of the server has been increased and the immersion liquid cooling method also has shown apparent limitations on heat dissipation. In the existing technologies, it is mainly by increasing the oil pump injecting distance to increase the circulation speed of the coolant. But since the viscous force of the immersion liquid is generally greater than that of the pure water, which causes limited improvement on the oil pump performance, the power consumption of the pump may be nonetheless increased, and accordingly, there can be limited improvement on the partial flow velocity for high heat generating devices. Moreover, due to physical barrier and high temperature effect of the heat generating device, the flow velocity of the fluid surrounding the heat generating device is lower than that on both sides of the heat generating device, i.e., the flow of the coolant surrounding the heat generating device is slower. In the existing technologies, there is also a way to improve the heat dissipation efficiency by increasing the quantity of heat dissipation devices or reducing the contact heat resistance between the heat generating device and the heat dissipation devices. However, increasing the heat conduction efficiency may lead to limited improvement on the overall heat dissipation efficiency, usually only within 2 to 3 degrees; and the differences resulted from different contact manners are also subtle, basically within 1 degree. Accordingly, the heat dissipation methods in the existing technologies cannot achieve good heat dissipation effect, and the heat dissipation efficiency of the heat generating device is relatively low, which makes it a bottleneck for improving the heat dissipation efficiency.

SUMMARY

In one aspect of the present disclosure, a heat dissipation system is provided. The heat dissipation system includes: a coolant, configured to contact at least a portion of a heat generating device; and a convection accelerator disposed in a predetermined area around the heat generating device, configured to accelerate a flow of the coolant around the heat generating device.

In some embodiments, the convection accelerator includes a sheet structure configured to vibrate to accelerate convection of the coolant.

In some embodiments, a first chamber and a second chamber are disposed on two sides of the sheet structure, respectively; and during vibrations of the sheet structure, each of the first chamber and the second chamber alternately absorbs and ejects the coolant.

In some embodiments, the convection accelerator further includes a first housing. The sheet structure is disposed inside the first housing and divides an internal space of the first housing into the first chamber and the second chamber.

In some embodiment, a first opening and a second opening are disposed in the first chamber and the second chamber, respectively. During the vibrations of the sheet structure toward the first chamber, the coolant in the first chamber is ejected outward through the first opening, and the second chamber absorbs external coolant through the second opening. During the vibration of the sheet structure toward the second chamber, the coolant in the second chamber is ejected outward through the second opening, and the first chamber absorbs external coolant through the first opening.

In some embodiments, a chamber is placed on one side of the sheet structure, configured to absorb or eject the coolant during the vibration of the sheet structure.

In some embodiments, the chamber includes: a first inlet configured to eject the coolant outward during the vibrations of the sheet structure toward the chamber; and a first outlet configured to absorb external coolant during the vibrations of the sheet structure further from the chamber.

In some embodiments, the sheet structure is disposed in the coolant, configured to push the coolant located on both sides of the sheet structure.

In some embodiments, the sheet structure is disposed in a first direction of the heat generating device; and a vibration direction of the sheet structure is parallel or perpendicular to the first direction.

In some embodiments, the convection accelerator includes a blade rotation structure configured to accelerate the coolant surrounding the heat generating device by centrifugal actions of blade rotation.

In some embodiments, the convection accelerator further includes a second housing. A second inlet and a second outlet facing the heat dissipation device are disposed in the second housing, and the blade rotation structure is disposed inside the second housing. The coolant enters the second housing through the second inlet and is ejected outward through the second outlet after accelerated by the blade rotation structure.

In some embodiments, the blade rotation structure is disposed in the coolant, configured to disturb and accelerate the coolant surrounding the blade rotation structure.

In some embodiments, the convection accelerator includes a flow guiding structure. The flow guiding structure includes: a third outlet disposed toward the heat generating device, and a third inlet having a larger size than the outlet. The coolant enters the flow guiding structure through the third inlet and is accelerated to be ejected through the third outlet.

In some embodiments, the heat dissipation system further includes: a circulation device configured to circulate the coolant; a heat exchanger, configured to exchange heat between an internal environment and an external environment of the heat dissipation system; and a controller configured to adjust an operating parameter of the convection accelerator.

In some embodiments, the coolant is a phase change material.

In another aspect of the present disclosure, a heat dissipation method is provided. The heat dissipation method includes: disposing a coolant around a portion of a heat generating device; disposing a convection accelerator in a predetermined area around the heat generating device; and accelerating, by the convection accelerator, a flow of the coolant around the heat generating device.

In some embodiments of the heat dissipation method, the convection accelerator includes a sheet structure configured to vibrate to accelerate convection of the coolant.

In some embodiments of the heat dissipation method, a first chamber and a second chamber are disposed on two sides of the sheet structure, respectively. During vibrations of the sheet structure, each of the first chamber and the second chamber alternately absorbs and ejects the coolant.

The above aspects will be described in detail with accompanying drawings.

BRIEF DESCRIPTION OF THE DRAWINGS

The above and other objects, features and advantages of the present disclosure will become more apparent from the description of the embodiments of the present disclosure by referring to the accompanying drawings. In the following drawings.

DETAILED DESCRIPTION OF THE EMBODIMENTS

Figure 1:
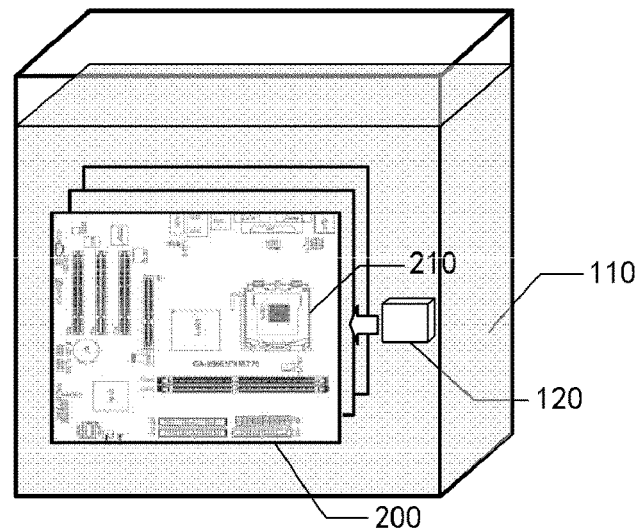
FIG. 1 illustrates an application scenario of a heat dissipation system according to some embodiments of the present disclosure.

Hereinafter, embodiments of the present disclosure will be described with reference to the drawings. It should be understood, however, that the description is only illustrative, and is not intended to limit the scope of the disclosure. In the following detailed description, numerous specific details are set forth. However, it is apparent that one or more embodiments may be practiced without these specific details. In addition, descriptions of well-known structures and techniques are omitted in the following description in order to avoid unnecessarily obscuring the concept of the present disclosure.

The terminology used herein is for the purpose of describing a specific embodiment and is not to limit the present disclosure. The terms "including", "comprising", etc., are used to indicate the presence of the features, operations and/or components, but do not exclude the presence or addition of one or more other features, operations or components.

All terms (including technical and scientific terms) used herein have the meaning commonly understood by one of ordinary skill in the art, unless otherwise defined. It should be noted that the terms used herein are to be interpreted as having a meaning consistent with the context of the present specification and should not be interpreted in an ideal or too rigid manner.

Where an expression similar to "at least one of A, B, and C, etc." is used, it should generally be interpreted in accordance with the meaning of the expression as commonly understood by those skilled in the art (for example, "a device having at least one of: A, B, and C" shall include, but is not limited to, a device having A alone, B alone, C alone, A and B, A and C, B and C, and/or A, B, C, etc.). Where an expression similar to "at least one of A, B or C, etc." is used, it should generally be interpreted according to the meaning of the expression as commonly understood by those skilled in the art (for example, "a device having at least one of A, B or C" shall include, but is not limited to, a device having A alone, B alone, C alone, A and B, A and C, B and C, and/or A, B, C, etc.). Those skilled in the art will also appreciate that transitional conjunctions and/or phrases that arbitrarily represent two or more optional items, whether in the specification, claims, or drawings, are to be construed as the possibility of one of the items, either or both of two items. For example, the phrase "A or B" should be understood to include the possibility of "A" or "B", or "A and B".

According to some embodiment of the present disclosure, a heat dissipation system is provided. The heat dissipation system includes: a coolant, configured to contact at least a portion of a heat generating device; and a convection accelerator disposed in a predetermined region surrounding the heat generating device, configured to accelerate a flow of the coolant surrounding the heat generating device.

In the present disclosure, according to some embodiments of the heat dissipation system, the heat generating device may be at least partially immersed in the coolant, for example, all immersed or semi-immersed, and a convection accelerator may be disposed surrounding the heat dissipation device to accelerate the flow of the fluid surrounding the heat dissipation device, thereby improving a heat dissipation efficiency of the heat generating device and greatly decreasing an operating temperature of the heat generating device to effectively break a heat dissipation bottleneck of an immersion liquid cooling system.

FIG. 1 illustrates an application scenario of a heat dissipation system according to some embodiment of the present disclosure. It should be noted that FIG. 1 is only an example of an application scenario in which a heat dissipation system of an embodiment of the present disclosure may be applied, to help those skilled in the art understand the technical content of the present disclosure, but does not mean that the embodiment of the present disclosure may not be applied to other devices, environments or scenarios.

As shown in FIG. 1, the heat dissipation system of the embodiment of the present disclosure may be applied to a heat generating device. The heat generating device may be, for example, a server mainboard 200 or a certain functional component 210 on the server mainboard 200. The functional component 210 may be, for example, a CPU or a GPU. The heat generating device generates a large amount of heat during operation, and in order to decrease its operating temperature, the heat generating device may be immersed in a non-conductive, non-corrosive, non-flammable coolant 110, as shown in FIG. 1 (the gray portion in FIG. 1 indicates the heat-dissipating fluid). The coolant 110 directly carries away heat.

As power of chips increases, the immersion liquid cooling has shown apparent heat dissipation limitations. For example, a high-power GPU due to small chip area and high heat flux density, despite the use of immersion liquid cooling, which is a highly efficient heat dissipation method, still appears to be overheated. Moreover, due to a high temperature and a physical blocking of the heat generating device, a flow velocity of the fluid surrounding the heat generating device may be lower than a flow velocity of the fluid on both sides of the heat generating device, which results in a low heat dissipation efficiency of the heat generating device.

According to the heat dissipation system of some embodiment of the present disclosure, the convection accelerator 120 is disposed in a surrounding region of the heat generating device. Under an action of the convection accelerator 120, the flow velocity of the coolant surrounding the heat generating device may be increased, and the heat dissipation efficiency of the heat generating device may be improved.

It can be understood that the application scenario in FIG. 1 is only an exemplary embodiment. In addition to being applicable to the server mainboard or functional components on the server mainboard, the heat dissipation system 100 can also be applied to an electronic device, such as a server, which may be immersed in the coolant as a whole, and the coolant and the convection accelerator may be used to achieve an efficient heat dissipation of the server.

Figure 2:
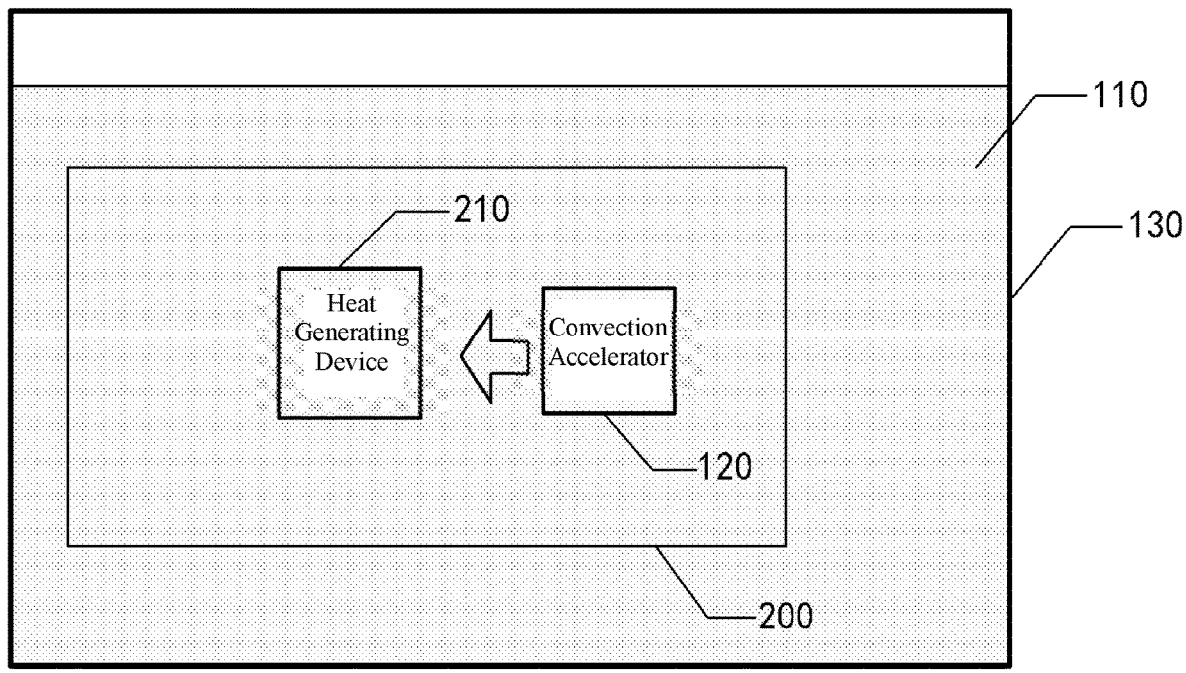
FIG. 2 is a first schematic diagram of a heat dissipation system according to some embodiments of the present disclosure.

FIG. 2 is a first schematic diagram of a heat dissipation system according to some embodiment of the present disclosure.

As shown in FIG. 2, the heat dissipation system includes a coolant 110 and a convection accelerator 120.

The coolant 110 is configured to contact at least a portion of the heat generating device, as shown in FIG. 2 (the gray portion indicates the coolant).

The heating generating device may be a functional component on the server mainboard, such as a CPU or GPU; the heating generating device may also be the server mainboard or the entire server, or any other electronic device or component that can be immersed in a fluid for heat dissipation. Hereinafter, the embodiment of the present disclosure will be described in an example of a functional component on the server mainboard as a heat generating device.

The coolant 110 may be placed in a housing 130 and the heat generating device may also be placed in the housing 130. The housing 130 may be, for example, a server housing. The coolant 110 may be a non-conductive, non-corrosive, non-flammable liquid, such as a fluorinated liquid, a silicone oil, a mineral oil, etc.

According to some embodiment of the present disclosure, the coolant includes a fluid that undergoes a phase change in the heat dissipation system, or a fluid that does not undergo a phase change in the heat dissipation system. In some embodiments of the present disclosure, the immersion liquid cooling may refer to a single-phase immersion or a two-phase immersion. In the single-phase immersion, the coolant may be a fluid not prone to phase change, and the coolant may have a high boiling point, and there is forced convection between the coolant and the immersed heat generating device, so that the heat generated by the heat generating device can be carried away by the coolant. In the two-phase immersion, the heat-dissipating fluid may be a fluid prone to phase change. The coolant may a low boiling point, and may be boiling on the surface of the heat generating device, and evaporate from a liquid state to a gaseous state, to carry away heat.

The convection accelerator 120 may be immersed in the coolant 110 and disposed in a predetermined region surrounding the heat generating device 210, configured to accelerate the flow of the coolant surrounding the heat generating device 210. The convection accelerator 120 can disturb and accelerate the flow of the coolant, increase the flow velocity in a local area of the heat generating device, and enhance a fluid convection intensity.

According to some embodiment of the present disclosure, the heat generating device may be at least partially immersed in the coolant, and a convection accelerator may be disposed surrounding the heat dissipation device to accelerate the flow of the fluid around the heat dissipation device, thereby improving the heat dissipation efficiency of the heat generating device and greatly decreasing the temperature of the heat generating device (to 10 degrees or more), to effectively break the dissipation bottleneck of the immersion liquid cooling system. Moreover, the convection accelerator of the present disclosure may have a small size, cost low, and have high reliability.

Figure 3:
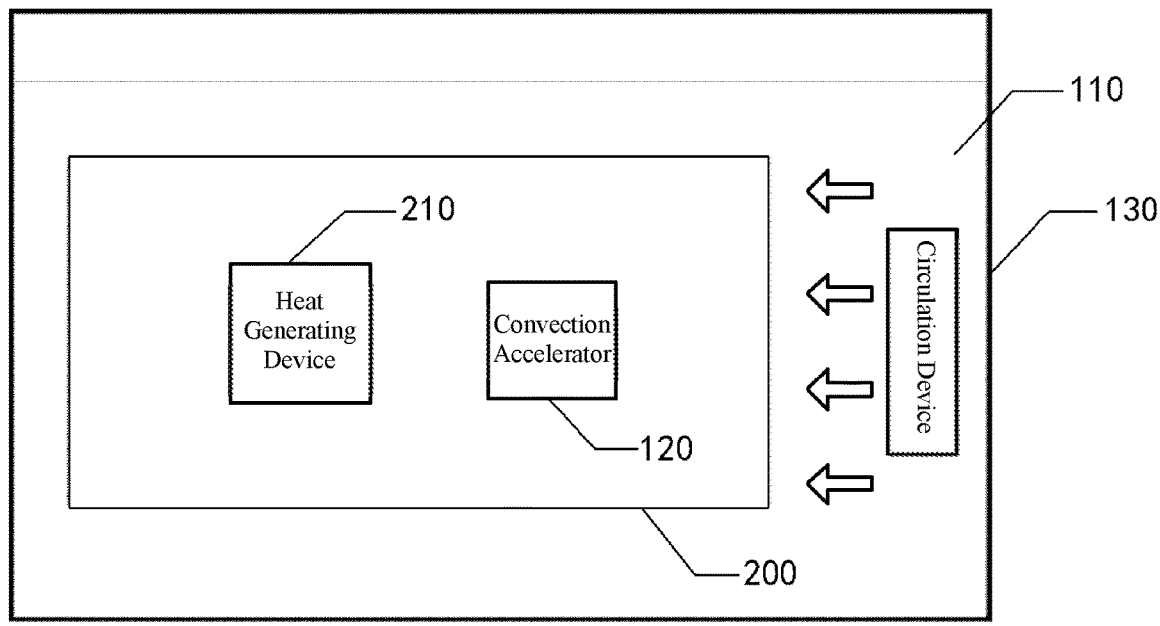
FIG. 3 is a second schematic diagram of a heat dissipation system according to some embodiments of the present disclosure.

FIG. 3 is a second schematic diagram of a heat dissipation system according to some embodiment of the present disclosure.

According to some embodiment of the present disclosure, as shown in FIG. 3, the heat dissipation system may further include a circulation device, which may be, for example, a fluid pump, configured to achieve an overall circulating flow of the coolant within the housing 130 (the coolant not shown in FIGS. 3 to 14).

Figure 4:
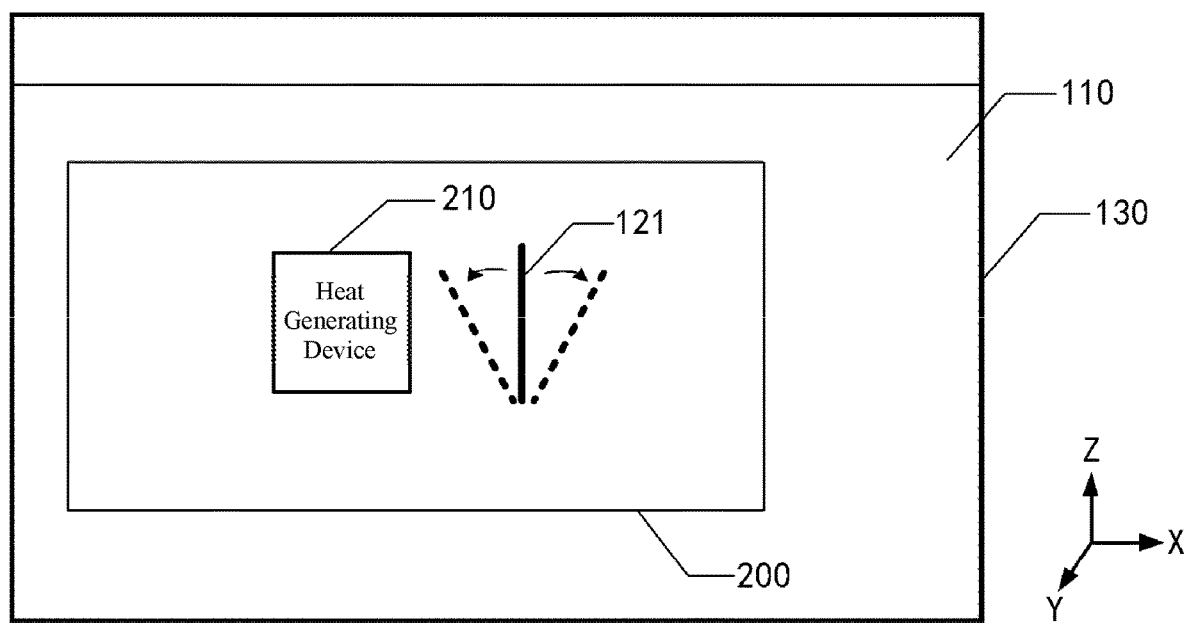
FIG. 4 is a schematic diagram of a convection accelerator according to some embodiments of the present disclosure.

FIG. 4 is a schematic diagram of a convection accelerator according to some embodiment of the present disclosure.

According to some embodiment of the present disclosure, as shown in FIG. 4, the convection accelerator 120 may include a sheet structure 121 that is capable of vibrating under control, to accelerate the flow of the surrounding coolant.

According to some embodiment of the present disclosure, the sheet structure 121 may be directly placed in the coolant 110, configured to push the coolant located on both sides of the sheet structure 121.

The vibration of the sheet structure 121 may be a reciprocating motion. For example, the sheet structure 121 may oscillate centering one end. As shown in FIG. 3, the sheet structure 121 may oscillate in opposite directions to a position indicated by a broken line. During the oscillation process, the sheet structure 121 pushes the surrounding coolant to flow along the sheet structure 121, changes the flow direction of the coolant, provides a driving force for the coolant and accelerate the flow of the coolant.

Figure 5:
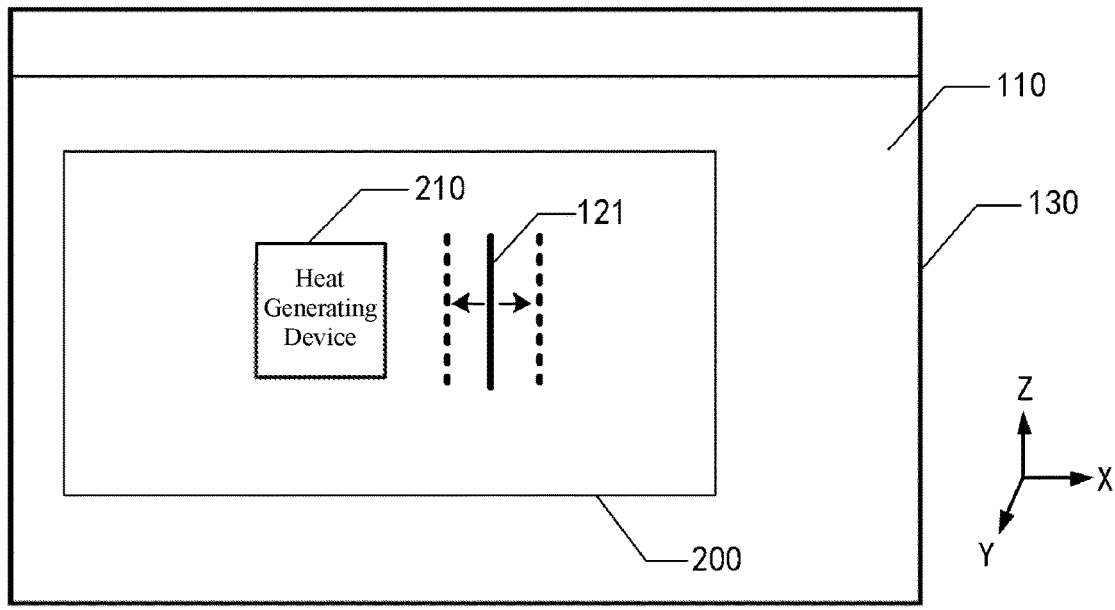
FIG. 5 is a schematic diagram of a vibration mode of a sheet structure according to some embodiments of the present disclosure.

FIG. 5 illustrates a vibration mode of a sheet structure according to some embodiment of the present disclosure.

As shown in FIG. 5, the vibration of the sheet structure 121 may also be a back-and-forth motion in a direction perpendicular to the sheet structure 121. During the back-and-forth motion of the sheet structure 121 in opposite directions along the heat generating device, the coolant on both sides of the sheet structure may be pushed to flow in opposite directions to form a turbulent flow. At the same time, the pushing force of the sheet structure 121 can accelerate the coolant and further enhance the convection intensity.

Further, the sheet structure 121 may vibrate in other manners, for example, a central portion of the sheet structure 121 may vibrate in opposite directions.

The sheet structure 121 may have be square, sector-shaped, circular, etc.

An area of the sheet structure 121 can be adjusted. For example, the sheet structure 121 may be a folded structure. In some cases, the folded structure may be opened to increase a contact area of the sheet structure 121 with the coolant.

A plurality of sheet structures 121 may be disposed corresponding to one heat generating device, and some of the sheet structures 121 may be opened or closed as needed.

According to some embodiment of the present disclosure, the sheet structure 121 may be disposed in a first direction of the heat generating device 210; a vibration direction of the sheet structure 121 may be parallel or perpendicular to the first direction.

As shown in FIGS. 4 and 5, the sheet structure 121 may be disposed in +X direction of the heat generating device 210, and the vibration direction of the sheet structure 121 may be ±X direction. Accordingly, the vibration direction of the sheet structure 121 can be parallel to the first direction.

Figure 6:
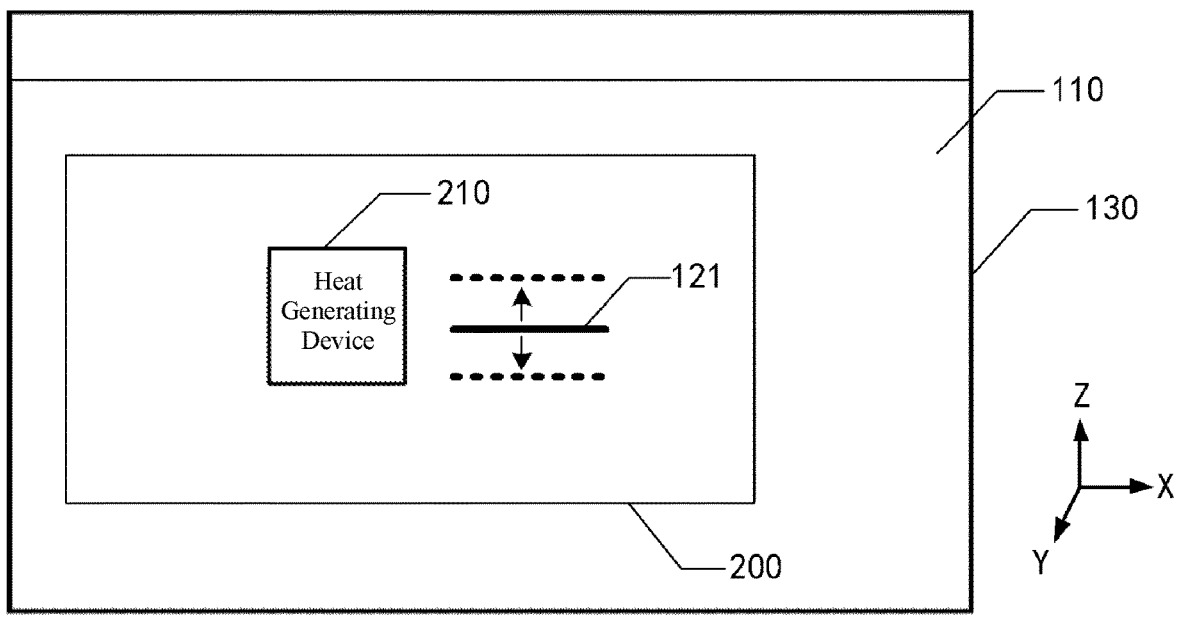
FIG. 6 illustrates a disposition of a sheet structure according to some embodiments of the present disclosure.

FIG. 6 illustrates a disposition of a sheet structure according to some embodiment of the present disclosure.

As shown in FIG. 6, the sheet structure 121 may be disposed in the +X direction of the heat generating device 210, and the vibration direction of the sheet structure 121 may be ±Z direction. Accordingly, the vibration direction of the sheet structure 121 may be perpendicular to the first direction.

In other embodiments of the present disclosure, the disposition position of the sheet structure 121 may be located in any direction of the heat generating device 210, for example, ±X, ±Y or ±Z direction, or between any two of the above directions, i.e., direction 45° from +X to +Z. The present disclosure does not impose limitations on the distance between the sheet structure 121 and the heat generating device 210, as long as the vibration of the sheet structure 121 can affect the flow of the fluid surrounding the heat generating device 210.

Figure 7:
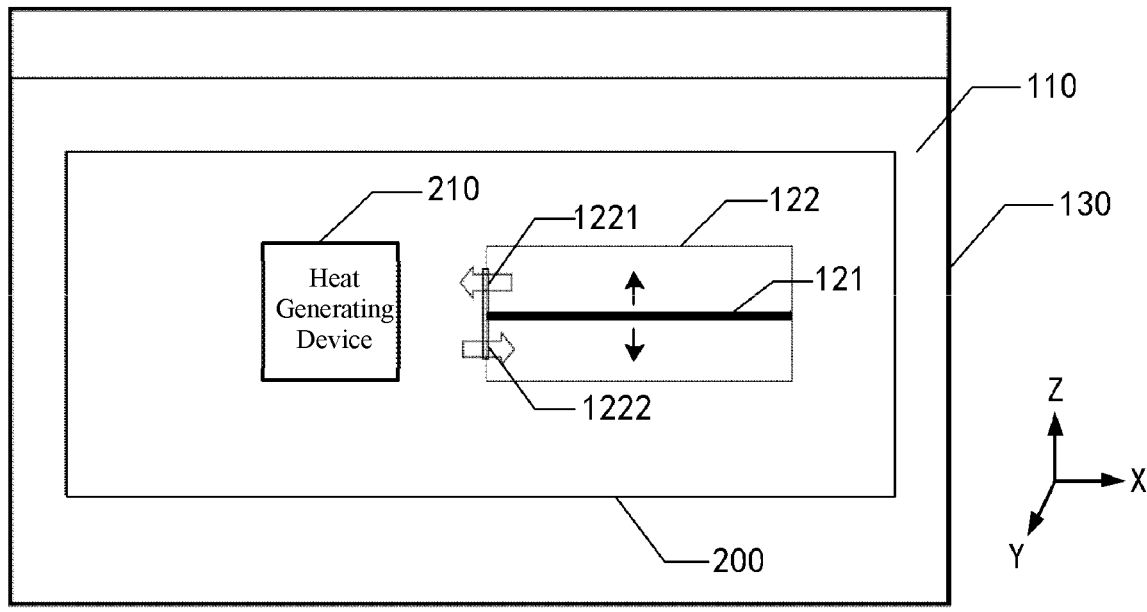
FIG. 7 is a first schematic diagram of a convection accelerator according to some embodiments of the present disclosure.

FIG. 7 is a first schematic diagram of a convection accelerator according to some embodiment of the present disclosure.

As shown in FIG. 7, according to some embodiment of the present disclosure, a chamber may be each disposed on both sides of the sheet structure 121. For example, the sheet structure 121 may be disposed in a first housing 122, and the sheet structure 121 divides an internal space of the housing 122 into two chambers that are not connected to each other.

During the vibration of the sheet structure 121, volumes of the two chambers may change, to alternately absorb and eject the coolant. For example, when the sheet structure 121 vibrates upward as shown in FIG. 6, an internal volume of a first chamber located above becomes smaller and ejects the coolant outward, and an internal volume of a second chamber located below becomes larger and absorbs external coolant, and vice versa.

The sheet structure 121 can be driven by electromagnetic force to perform periodic up-and-down back-and-forth motion. For example, the sheet structure 121 may be a metal piece, and electromagnets may be disposed on upper and lower surfaces of the first housing 122, and when the electromagnets are energized, they can attract the sheet structure 121 to move in a corresponding direction.

According to some embodiment of the present disclosure, a first opening 1221 and a second opening 1222 may be disposed in the first chamber and the second chamber, respectively.

During an upward vibration of the sheet structure 121, the internal volume of the first chamber becomes smaller, and the coolant in the first chamber is pressed, so that the coolant may be ejected outward through the first opening 1221. At the same time, the internal volume of the second chamber becomes larger, a negative pressure may be formed in an internal space of the second chamber with respect to an external environment, and the coolant that absorbs the fluid outside the second chamber enters the second chamber through the second opening 1222.

During the downward vibration of the sheet structure 121, the internal volume of the second chamber becomes smaller, and the coolant in the second chamber may be pressed, so that the coolant may be ejected outward through the second opening 1222. At the same time, the internal volume of the first chamber becomes larger, a negative pressure may be formed in an internal space of the first chamber with respect to the external environment, and the coolant that absorbs the fluid outside the first chamber enters the first chamber through the first opening 1221.

Accordingly, as the sheet structure 121 performs a back-and-forth motion, the first opening 1221 and the second opening 1222 alternately eject and absorb the coolant, causing disturbance and acceleration to the surrounding coolant. The first opening 1221 and the second opening 1222 may be disposed toward the heat generating device 210 such that the coolant ejected through the first opening 1221 and the second opening 1222 may directly act on the heat generating device 210.

The sheet structure 121 and the chambers on both sides can form a vibrating membrane fluidic generator, and the vibrating membrane fluidic generator forms a local high-speed jet, which greatly enhances the liquid convection intensity on the surface of the high heat generating device, so that the high heat generating device can effectively dissipate heat and greatly reduce the temperature.

Figure 8:
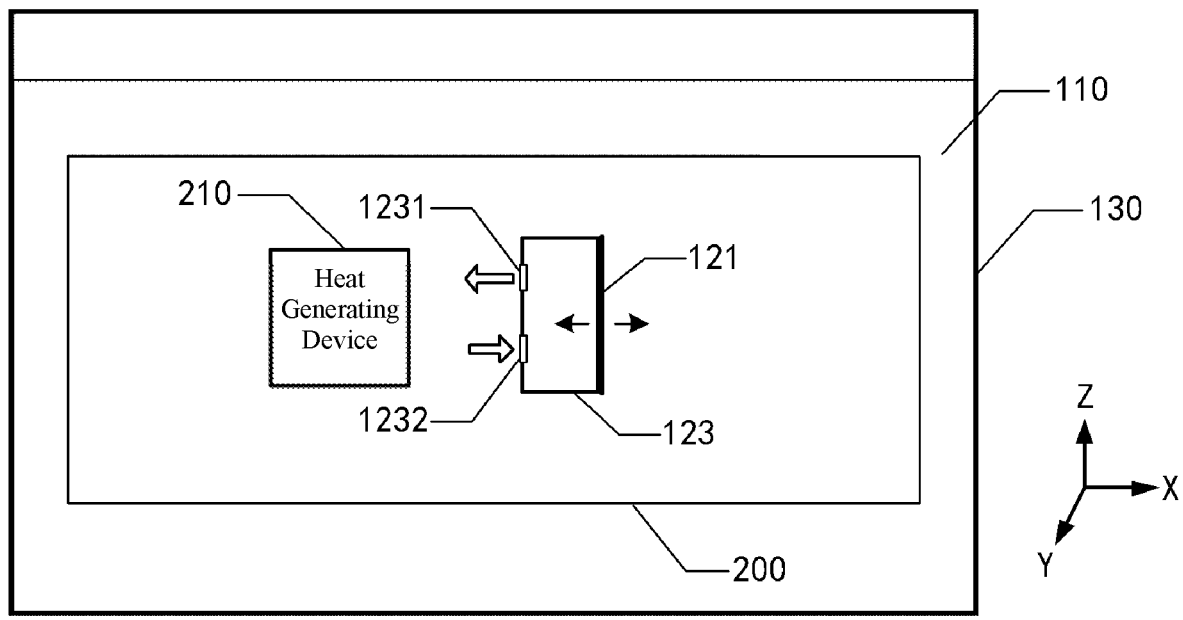
FIG. 8 is a second schematic diagram of a convection accelerator according to some embodiments of the present disclosure.

FIG. 8 is a second schematic diagram of a convection according to some embodiment of the present disclosure.

According to some embodiment of the present disclosure, as shown in FIG. 8, a chamber may be disposed on only one side of the sheet structure 121. For example, a housing 123 and the sheet structure 121 may enclose a chamber, and the sheet structure 121 can move relative to the housing 123, thereby changing a volume of the chamber; during the vibration of the sheet structure 121, the chamber absorbs or ejects the coolant.

According to some embodiment of the present disclosure, an inlet 1231 and an outlet 1232 may be disposed in the chamber.

During the vibration of the sheet structure 121 toward the chamber (−X direction), the volume of the chamber becomes smaller, and the coolant inside the chamber may be pressed to be ejected outward through the outlet 1232, and during the process, the inlet 1231 may be closed.

During the vibration of the sheet structure 121 in a direction away from the chamber (+X direction), the volume of the chamber becomes large, and a negative pressure may be formed with respect to the external environment, and the coolant outside the chamber may be absorbed and flow into the chamber through the inlet 1231. During this process, the outlet 1232 may be closed.

Accordingly, by the back-and-forth motion of the sheet structure 121, the chamber alternately ejects and absorbs the coolant, causing the disturbance and acceleration of the surrounding coolant. The inlet 1231 and the outlet 1232 may be disposed toward the heat generating device 210.

In other embodiments of the present disclosure, the inlet 1231 and the outlet 1232 may be switched to each other under control. For example, during one vibration, the inlet 1231 absorbs fluid, the outlet 1232 ejects fluid; during a next vibration, the inlet 1231 and the outlet 1232 may be controlled to switch to each other by controlling an open/close state of the inlet 1231 and the outlet 1232, and the inlet 1231 may be controlled to eject a fluid and the outlet 1232 may be controlled to absorb a fluid.

In other embodiments of the present disclosure, the inlet 1231 and the outlet 1232 may also be replaced by an opening, that is, the opening may be used as an inlet to absorb the coolant, or as an outlet to eject the coolant.

Figure 9:
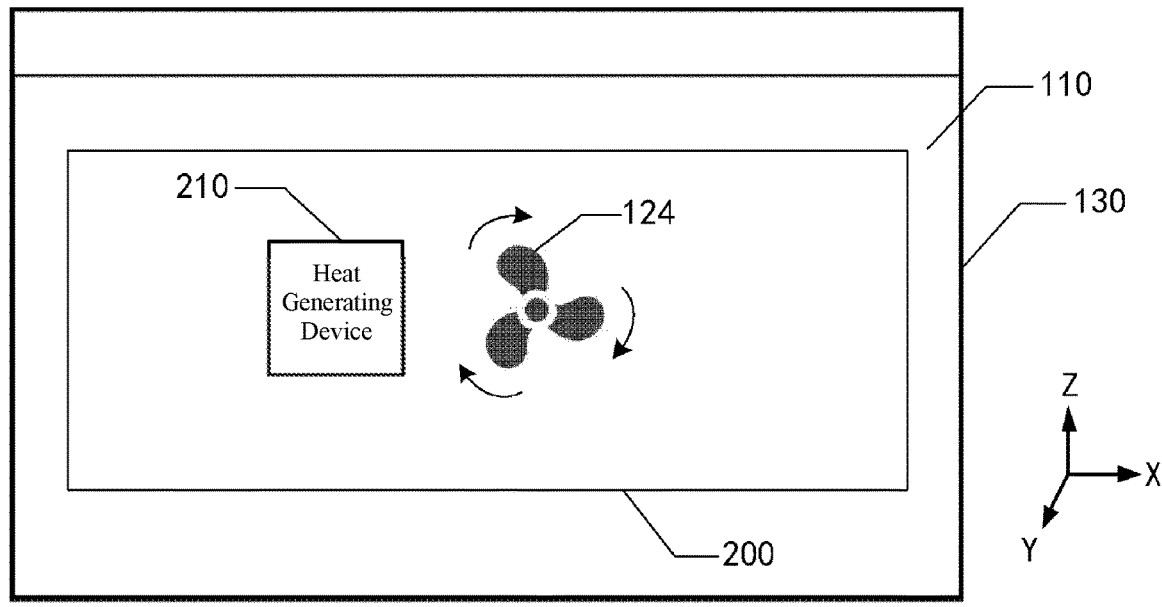
FIG. 9 is a third schematic diagram of a convection accelerator according to some embodiments of the present disclosure.

FIG. 9 is a third schematic diagram of a convection accelerator according to some embodiment of the present disclosure.

According to some embodiment of the present disclosure, as shown in FIG. 9, the convection accelerator includes a blade rotating structure 124, configured to accelerate the coolant surrounding the heat generating device by a centrifugal action of a blade rotation.

The blade rotating structure 124 includes a rotating shaft and a plurality of blades uniformly disposed along a circumferential direction of the rotating shaft, and the rotating shaft may be connected to a motor to drive the blades to rotate. During the rotation of the blades, the surrounding coolant may be disturbed by the rotating blades, the flow direction may change, and the flow velocity may be increased, thereby further enhancing the heat dissipation efficiency of the nearby heat-generating device 210.

Figure 10:
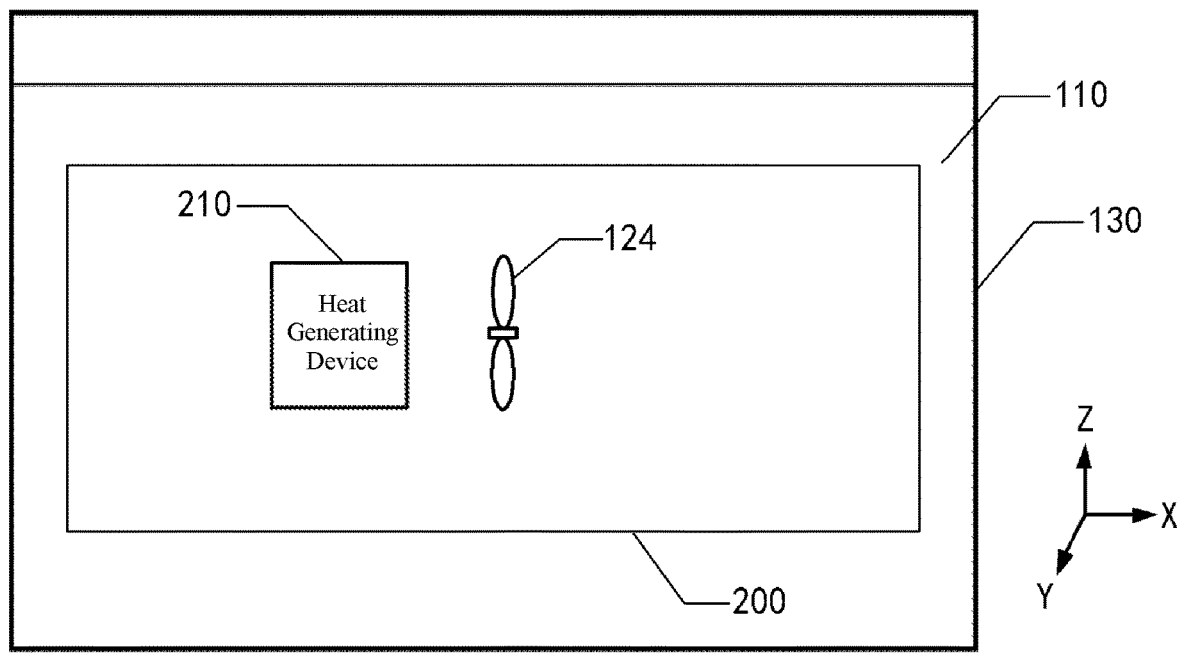
FIG. 10 illustrates a disposition angle of a blade rotation structure according to some embodiments of the present disclosure.

The blade rotation structure 124 may be disposed in a first direction of the heat generating device 210, such as the +X direction as shown in FIG. 8, and a rotation plane of the blade rotation structure 124 may be parallel or perpendicular to the first direction. As shown in FIG. 8, an XZ plane is the rotation plane of the blade rotation structure 124, the XZ plane is parallel to the X direction. FIG. 10 illustrates a disposition angle of a blade rotation according to some embodiment of the present disclosure.

As shown in FIG. 10, the blade rotation structure 124 may be disposed in the +X direction of the heat generating device, and a YZ plane is the rotation plane of the blade rotation structure 124, and the YZ plane is perpendicular to the X direction.

In other embodiments of the present disclosure, the blade rotating structure 124 may be disposed in any direction of the heat generating device 210, for example, ±X, ±Y or ±Z direction, or between any two of the above directions, as long as the rotation of the blade rotation structure 124 can affect the flow of the fluid surrounding the heat generating device 210.

The height of the blade rotation structure 124 may be adjustable, to adjust the spatial relationship between the blade rotation structure 124 and the heat generating device.

The blade tilt angle of the blade rotating structure 124 may also be adjustable. When the blade tilt angles are different, the blade rotating structure 124 may also have different disturbing effects on the surrounding fluid.

The blade rotation structure 124 can be disposed directly in the coolant 110, or may be disposed in the housing.

Figure 11:
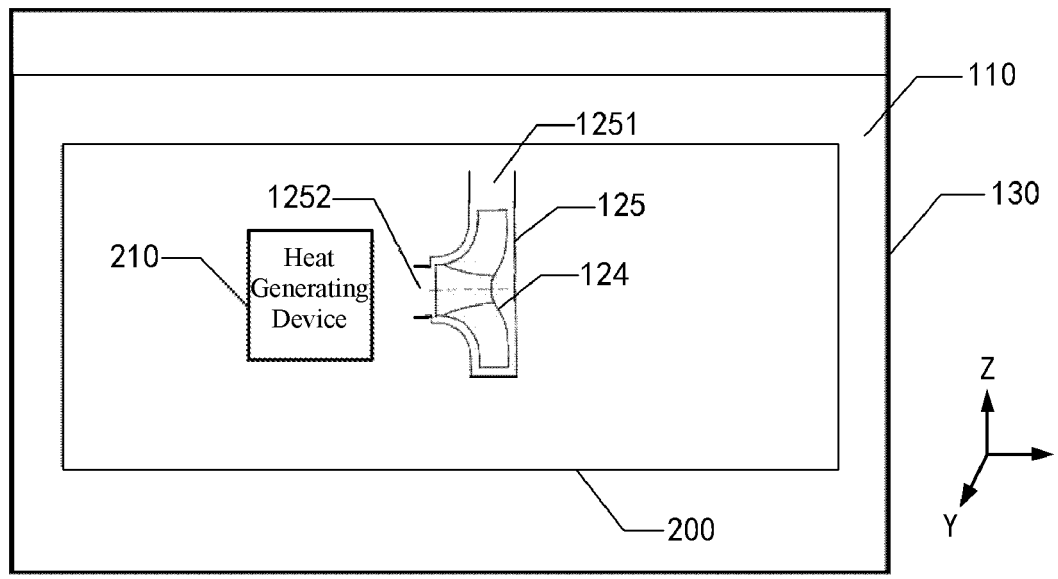
FIG. 11 illustrates a convection accelerator according to some embodiments of the present disclosure.

FIG. 11 is a schematic diagram of a convection accelerator according to some embodiments of the present disclosure.

As shown in FIG. 11, according to some embodiment of the present disclosure, the convection accelerator further includes a second housing 125, and the blade rotation structure 124 is disposed inside the second housing 125.

An inlet 1251 and an outlet 1252 facing the heat dissipation device may be disposed in the second housing 125. The inlet 1251 introduces the coolant along a tangent to the blade rotation structure 124, and the outlet 1252 outputs the coolant along an axis of the blade rotation structure 124. The coolant enters the second housing 125 through the inlet 1251, and may be accelerated by the blade rotation structure 124 and ejected outward through the outlet 1252.

The second housing 125 and the blade rotating structure 124 may constitute an accelerating centrifugal pump. The accelerating centrifugal pump may form local high-speed injection to improve the heat dissipation efficiency.

Figure 12:
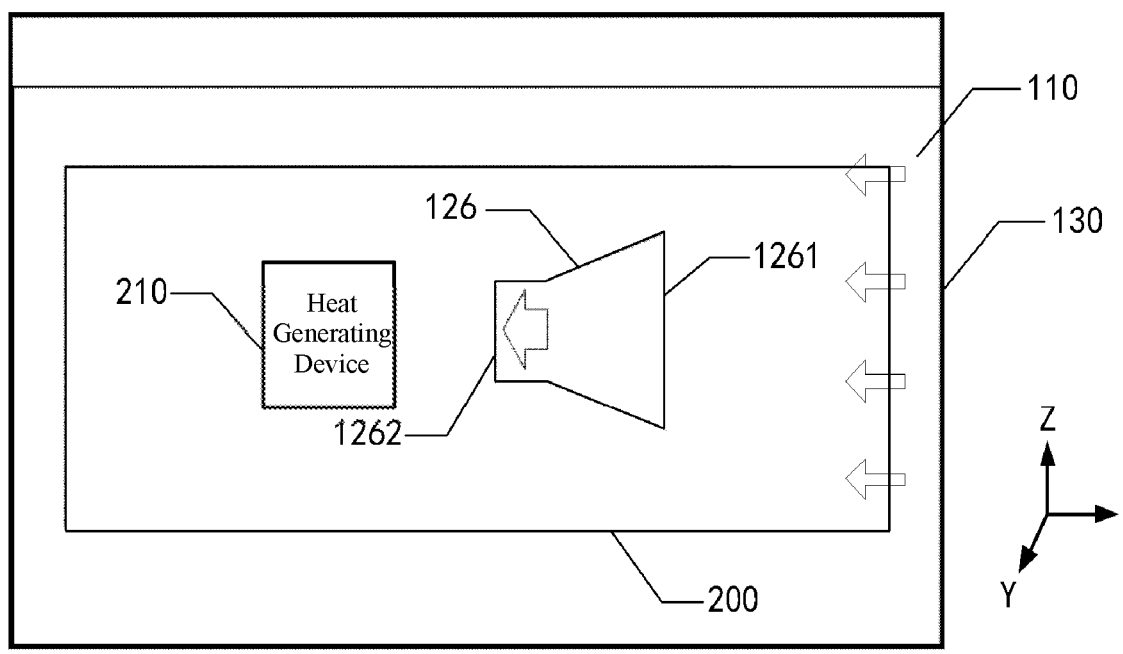
FIG. 12 is a fourth schematic diagram of a convection accelerator according to some embodiments of the present disclosure.

FIG. 12 is a fourth schematic diagram of a convection accelerator according to some embodiment of the present disclosure.

According to some embodiment of the present disclosure, as shown in FIG. 12, the convection accelerator includes a flow guiding structure 126. The flow guiding structure 126 includes an inlet 1261 and an outlet 1262. A size of the inlet 1261 may be larger than a size of the outlet 1262, and the outlet 1262 may be disposed facing the heat generating device 210. The inlet 1261 faces an inflow direction of the coolant. The outlet close to the heat generating device has a small cross-sectional area and a small fluid flux; the inlet away from the heat generating device has a large cross-sectional area and a large fluid flux. Since the total amount of the fluid flowing into the inlet per unit time is equal to the total amount of the fluid flowing out of the outlet per unit time, the flow velocity of the fluid at the outlet is larger.

The coolant flows to the position of the inlet 1261, and enters the flow guiding structure 1261 through the inlet 1261. The diameter of the flow guiding structure 126 may be reduced from the inlet to the outlet, so that after the fluid flows in, the flow velocity may be gradually increased, and the coolant after the acceleration may be ejected to the heat generating device 210 through the outlet 1262.

According to some embodiment of the present disclosure, the flow guiding structure 126 may be a hollow cylindrical structure with open ends, the first end is opened larger and the second end is opened smaller, and the size from the first end to the second end may gradually decrease. The hollow cylindrical structure may be conical, such as a cone or a square cone, etc. The cylindrical structure may also include a multi-segment structure, for example, the first portion may be conical, and the second portion may be cylindrical, and the first portion and the second portion may be connected to form the flow guiding structure.

The cross-sectional shape of the flow guiding structure 126 may be determined based on the need, and may be, for example, a circle, an ellipse, a polygon, etc.

The material of the flow guiding structure 126 may be a rigid material or a flexible material. The shape of the flow guiding structure 126 may be fixed or adjustable. For example, the cross-sectional shape of the flow guiding structure 126 may be adjusted from a circular shape to an elliptical shape. The size of an outlet and an inlet of the flow guiding structure may be adjusted, for example, the inlet can be enlarged, and/or the outlet can be reduced to improve a convection efficiency and form more intense injection or disturbance. Conversely, the inlet may be reduced and/or the outlet may be enlarged, to reduce the convection intensity.

In other embodiments of the present disclosure, the flow guiding structure may also be two baffles, and a fluid passage may be formed between the two baffles. Areas of the inlet and the outlet of the flow guiding structure may be varied with opening and closing of the two baffles.

In other embodiments of the present disclosure, the outlet of the flow guiding structure may also be multiple, one side of the flow guiding structure may be an output side, and a plurality of outlets may be evenly disposed on the output side of the flow guiding structure. Certain outlets may be closed based on actual needs. If some outlets are closed, the flow velocity of other outlets can be increased, thereby increasing the heat dissipation efficiency of the heat generating device.

Figure 13:
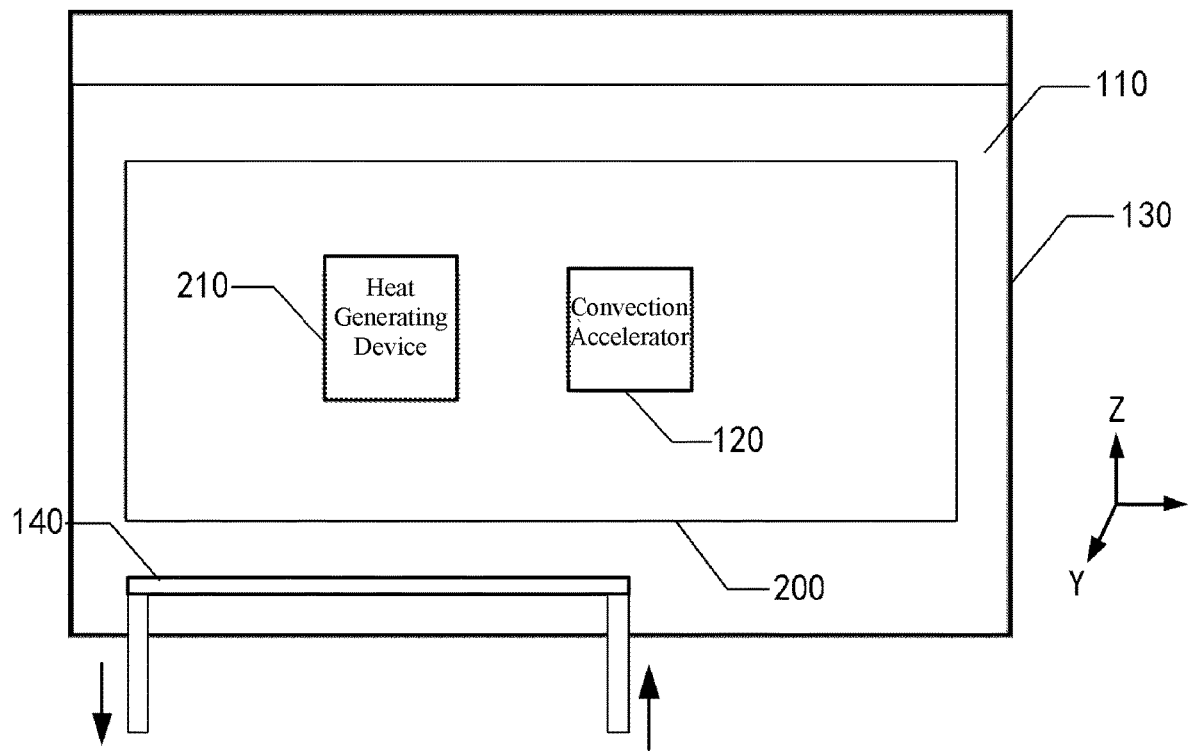
FIG. 13 is a third schematic diagram of a heat dissipation system according to some embodiments of the present disclosure.

FIG. 13 is a third schematic diagram of a heat dissipation system according to some embodiment of the present disclosure.

According to some embodiments of the present disclosure, as shown in FIG. 13, the heat dissipation system may further include a heat exchanger 140, configured to achieve heat exchange between the internal and external environments of the heat dissipation system.

Specifically, the heat exchanger 140 may be, for example, a tube heat exchanger. One end of the tube heat exchanger may be connected to external cold water, and the cold water may absorb the heat of the coolant and be discharged from the other end of the tube heat exchanger. Thus, the tube heat exchanger may be used to decrease the temperature of the coolant.

Figure 14:
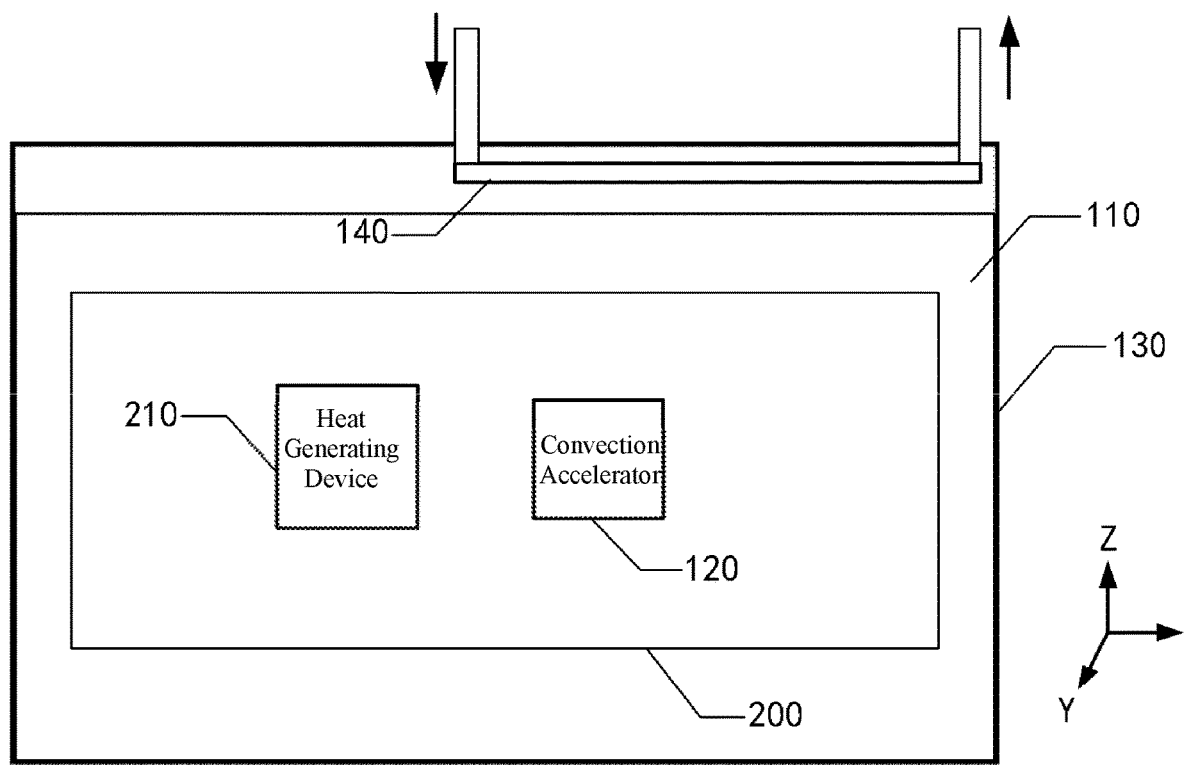
FIG. 14 is a schematic diagram of a heat exchanger according to some embodiments of the present disclosure.

FIG. 14 is a schematic diagram of a heat exchanger according to some embodiment of the present disclosure.

As shown in FIG. 14, for a two-phase immersion heat dissipation system, the heat exchanger 140 can condense the gaseous phase coolant 110. After the coolant 110 volatilizes, the gaseous phase coolant 110 may be condensed into a liquid and then dripped when contacting the heat exchanger 140 of lower temperature, which may effectively reduce the waste resulted from the volatilization of the coolant 110.

According to some embodiment of the present disclosure, the heat dissipation system may further include a controller, configured to adjust an operating parameter of the convection accelerator 120 according to control signals. For example, the controller may adjust operating parameters of the convection accelerator 120 based on temperature signals of the heat generating device.

In a situation when the convection accelerator 120 is a sheet structure 121, when the temperature of the heat generating device is high, an operating frequency of the convection accelerator 120 may be controlled to be increased. For example, a vibration frequency or a vibration amplitude of the sheet structure 121 may be increased, and an area of the sheet structure 121 may be enlarged, or the quantity of open sheet structures 121 may be increased, to enhance the disturbing action to the surrounding fluid of the sheet structure 121.

In a situation when the convection accelerator 120 is the blade rotation structure 124, when the temperature of the heat generating device is high, the rotation speed of the blade rotation structure 124 or the blade tilt angle may be increased, to enhance the disturbing action to the surrounding fluid of the blade rotation structure 124.

In a situation when the convection accelerator 120 is the flow guiding structure 126, when the temperature of the heat generating device is high, the inlet of the flow guiding structure 126 and/or the outlet may be increased to increase the ejection speed.

Those skilled in the art will appreciate that various combinations and/or combinations of the features of the various embodiments and/or claims of the present disclosure are possible, even if such combinations are not explicitly recited in the present disclosure. In particular, various combinations of the features described in the various embodiments and/or claims of the present disclosure can be made without departing from the spirit and scope of the present disclosure. All such combinations fall within the scope of the present disclosure.

Although the present disclosure has been shown and described with respect to the specific exemplary embodiments of the present disclosure, it can be understood by those skilled in the art, variations in form and detail can be made to the present disclosure. Therefore, the scope of the present disclosure should not be limited to the above-described embodiments, but should be determined not only by the appended claims but also by the equivalents of the appended claims.

What is claimed is:

1. A heat dissipation system, comprising:
    a liquid coolant, configured to immerse at least a portion of a heat generating device in a housing;
    a convection accelerator disposed in a predetermined area around the heat generating device, and configured to accelerate a local flow of the liquid coolant around the heat generating device; and
    a circulation device, immersed in the liquid coolant and configured to circulate the liquid coolant for an overall circulating flow in the housing.

2. The heat dissipation system according to claim 1, wherein the convection accelerator comprises:
    a sheet structure configured to vibrate to accelerate convection of the liquid coolant.

3. The heat dissipation system according to claim 2, wherein:
    a first chamber and a second chamber are disposed on two sides of the sheet structure, respectively; and
    during vibrations of the sheet structure, each of the first chamber and the second chamber alternately absorbs and ejects the liquid coolant.

4. The heat dissipation system according to claim 3, wherein the convection accelerator further comprises:
    a first housing, the sheet structure being disposed inside the first housing and dividing an internal space of the first housing into the first chamber and the second chamber.

5. The heat dissipation system according to claim 3, wherein:
    a first opening and a second opening are disposed in the first chamber and the second chamber, respectively; and
    when the sheet structure vibrates toward the first chamber, the liquid coolant in the first chamber ejects from the first housing to the housing through the first opening, and the second chamber absorbs the liquid coolant from the housing into the first housing through the second opening.

6. The heat dissipation system according to claim 2, wherein a chamber is placed on one side of the sheet structure, configured to absorb or eject the liquid coolant during the vibrations of the sheet structure.

7. The heat dissipation system according to claim 6, wherein the chamber comprises:
    a first inlet configured to eject the liquid coolant outward during the vibrations of the sheet structure toward the chamber; and
    a first outlet configured to absorb liquid coolant from the housing into the chamber, during the vibrations of the sheet structure further from the chamber.

8. The heat dissipation system according to claim 2, wherein the sheet structure is disposed in the liquid coolant, configured to push the liquid coolant located on both sides of the sheet structure.

9. The heat dissipation system according to claim 2, wherein:
    the sheet structure is disposed in a first direction of the heat generating device; and
    a vibration direction of the sheet structure is parallel or perpendicular to the first direction.

10. The heat dissipation system according to claim 1, wherein the convection accelerator comprises:
    a blade rotation structure, immersed in the liquid coolant and configured to accelerate the liquid coolant surrounding the heat generating device by centrifugal actions of blade rotation.

11. The heat dissipation system according to claim 10, wherein the convection accelerator further comprises:
    a second housing, a second inlet and a second outlet facing the heat dissipation device being disposed in the second housing, the blade rotation structure being disposed inside the second housing, the liquid coolant entering the second housing through the second inlet and being ejected outward through the second outlet after accelerated by the blade rotation structure.

12. The heat dissipation system according to claim 10, wherein the blade rotation structure is disposed in the liquid coolant, configured to disturb and accelerate the liquid coolant surrounding the blade rotation structure.

13. The heat dissipation system according to claim 1, wherein the convection accelerator comprises:
    a flow guiding structure, comprising:
        a third outlet disposed toward the heat generating device, and
        a third inlet having a larger size than the outlet;
        wherein the liquid coolant enters the flow guiding structure through the third inlet and is accelerated eject through the third outlet.

14. The heat dissipation system according to claim 1, further comprising:
    a heat exchanger, configured to exchange heat between an internal environment containing the liquid coolant and an external air environment of the heat dissipation system; and
    a controller, configured to adjust an operating parameter of the convection accelerator.

15. The heat dissipation system according to claim 1, wherein the liquid coolant includes a phase change material.

16. A heat dissipation method, comprising:
    immersing at least a portion of a heat generating device in a liquid coolant in a housing;
    disposing a convection accelerator in a predetermined area around the heat generating device for accelerating a local flow of the liquid coolant around the heat generating device; and
    immersing a circulation device in the liquid coolant for circulating the liquid coolant with an overall circulating flow in the housing.

17. The heat dissipation method according to claim 16, wherein the convection accelerator comprises:
    a sheet structure configured to vibrate to accelerate convection of the liquid coolant.

18. The heat dissipation method according to claim 17, wherein:
    a first chamber and a second chamber are disposed on two sides of the sheet structure, respectively; and
    when the sheet structure vibrates toward the first chamber, the liquid coolant in the first chamber ejects outward to the housing, and the second chamber simultaneously absorbs the liquid coolant from the housing into the first chamber.

19. The heat dissipation method according to claim 16, further comprising:
    configuring a heat exchanger at the housing for exchanging heat between an internal environment containing the liquid coolant and an external air environment of the heat dissipation system.

20. The heat dissipation method according to claim 16, wherein the liquid coolant includes a phase change material for a two-phase immersion cooling or a liquid having a boiling point for a single-phase immersion cooling.

* * * * *